(12) United States Patent
Behrends et al.

(10) Patent No.: US 7,675,794 B2
(45) Date of Patent: Mar. 9, 2010

(54) DESIGN STRUCTURE FOR IMPROVING PERFORMANCE OF SRAM CELLS, SRAM CELL, SRAM ARRAY, AND WRITE CIRCUIT

(75) Inventors: Derick G. Behrends, Rochester, MN (US); Sebastian Ehrenreich, Schoenau (DE); Juergen Pille, Stuttgart (DE); Otto Martin Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 11/954,672

(22) Filed: Dec. 12, 2007

(65) Prior Publication Data

US 2009/0154263 A1      Jun. 18, 2009

(51) Int. Cl.
*G11C 7/22* (2006.01)
(52) U.S. Cl. ............... 365/189.16; 365/189.011; 365/189.03; 365/189.08; 365/189.09
(58) Field of Classification Search .......... 365/198.011, 365/189.03, 189.16, 189.08, 189.09
See application file for complete search history.

(56) References Cited

U.S. PATENT DOCUMENTS

| 5,646,885 | A | * | 7/1997 | Matsuo et al. | ......... 365/185.05 |
| 5,757,696 | A | * | 5/1998 | Matsuo et al. | ......... 365/185.07 |
| 2007/0133260 | A1 | * | 6/2007 | Yamaoka et al. | ............ 365/154 |
| 2008/0106963 | A1 | * | 5/2008 | Wang et al. | ................. 365/207 |

* cited by examiner

*Primary Examiner*—Thong Q Le
(74) *Attorney, Agent, or Firm*—Joseph Petrokaitis

(57) ABSTRACT

A design structure embodied in a machine readable medium to improve performance of an SRAM cell or an SRAM array comprising a plurality of SRAM cells is described. The design structure includes a write circuit for an SRAM cell or an SRAM array. The write circuit includes a gate to switch the write circuit on and off. The cell is supplied by a first, higher voltage. The cell is accessible for read and write operations via at least one bit line connected to a write circuit. The cell is further addressable by at least one word line in order to access it by the bit line. To access the cell for read or write operations, the word line is supplied by the first, higher voltage and the bit line is supplied by a second, lower voltage. During write operations, the write circuit is driven by the first, higher voltage while the bit lines are still at the lower voltage.

3 Claims, 6 Drawing Sheets

US 7,675,794 B2

DESIGN STRUCTURE FOR IMPROVING PERFORMANCE OF SRAM CELLS, SRAM CELL, SRAM ARRAY, AND WRITE CIRCUIT

CROSS REFERENCE TO RELATED APPLICATIONS

This application is related to co-pending U.S. patent application Ser. No. 11/771,014, filed Jun. 29, 2007.

FIELD OF THE INVENTION

The present invention relates to Static Random Access Memory (SRAM) cell management and more particularly to a design structure for improving performance of SRAM cells without increasing overall power consumption.

BACKGROUND OF THE INVENTION

In an SRAM cell 10 shown in FIG. 1, each bit is stored on four transistors M1, M2, M3, M4 that form two cross-coupled inverters. SRAM cell 10 has two stable states which are used to denote '0' and '1'. Two additional access transistors M5, M6 serve to control the access to each SRAM cell 10 during read and write operations. Thus, it typically takes six transistors to store one memory bit.

Access to the SRAM cell 10 is enabled by a word line WL which controls the two access transistors M5, M6 which, in turn, control whether the cell 10 should be connected to the bit lines BL and BL'. The bit lines BL and BL' are used to transfer data for both read and write operations. While it is not strictly necessary to have two bit lines, both the signal and the inverse are typically provided since it improves noise margins.

If the word line WL is not asserted, the access transistors M5, M6 disconnect the cell 10 from the bit lines BL and BL'. If the cell 10 is disconnected, the two cross-coupled inverters continue to reinforce each other as long as they remain disconnected.

In order to read the cell 10, both bit lines BL and BL' are pre-charged to the same voltage before the word line WL connects the bit lines BL and BL' to the cell 10. By observing which bit line discharges to ground allows identifying whether a '0' or a '1' is stored in the cell 10.

In order to write the cell 10, two different voltages (i.e. ground and a voltage different from ground) are applied on the bit lines BL and BL' by a write circuit that is connected with the bit lines BL and BL' via its gate. Depending on which of the two bit lines BL and BL' is at ground and which of them is at the other voltage a '0' or a '1' is written to the cell 10.

Thereby, typical SRAM designs use the core logic voltage (Vdd) for the SRAM arrays including the SRAM cells (i.e. for the voltage different from ground).

Due to the loss of cell stability in recent technologies caused by low voltages, threshold voltage (Vt) scatter, increased relative variations and the like, an additional array cell specific voltage (Vcs) has been introduced to increase cell stability. While only the cell 10 is connected to this special voltage (Vcs), the word line WL, the bit line and also the write circuit remain at the lower voltage (Vdd). Due to this, (Vdd) is also known as bit line voltage. Doing so reduces the stress to the cell 10 during the read access and improves stability. In general, as a rule of thumb stability improves while the difference between the cell voltage (Vcs) and the bit line voltage (Vdd) grows.

On the other side for write, the cell 10 at the higher voltage (Vcs) needs to be overwritten with the lower voltage (Vdd). Thereby only a small corridor, further called operating window 20, remains where the array operates properly as shown in FIG. 2. This operating window 20 is represented by the region A in FIG. 2. It can be seen that this region is limited at Vdd/V≈0.9. To improve writeability, it is also known to connect the word line WL to (Vcs), but the limited operating window 20 still remains. Since both power supplies for (Vcs) and (Vdd) are independent from each other, in a worst-case scenario this operating window 20 is further reduced due to independent variations of the two voltages, caused by varying power supply, package and chip power distribution and the like, making it difficult to control. Ideally, (Vcs) has to track with (Vdd) to stay in the center of the operating window 20.

Alternatively, complex schemes have been proposed to switch between the two voltages, wherein (Vdd) is used for write and (Vcs) is used for read operations. A drawback of this solution is that a dummy cycle always needs to be introduced to switch between the two operations. Also the power consumption for write operations increases since the overall voltage level at the bit lines is increased which is driving the overall power consumption of the array.

SUMMARY OF THE INVENTION

It is therefore an object of the present invention to provide a design structure for improving the performance, particularly the writeability of an SRAM cell that is improved over the prior art and a corresponding SRAM cell, a corresponding SRAM array, and a corresponding write circuit.

A design structure is embodied in a machine readable medium. The design structure includes a write circuit for an SRAM cell or an SRAM array. The write circuit further includes a gate in order to switch the write circuit on and off. The write circuit is driven at a core logic voltage (Vdd). During write operations, the write circuit is driven by a higher cell specific voltage (Vcs).

In a first aspect of the invention, a method to improve performance of an SRAM cell or an SRAM array comprises the steps of providing a plurality of SRAM cells, each of the SRAM cells being supplied by a first, higher voltage (Vcs) and being accessible for read and write operations via at least one bit line (BL) connected to a write circuit, each of the SRAM cells further being addressable by at least one word line (WL), accessing at least one of the SRAM cells by using the bit line (BL), wherein the word line (WL) is supplied by the first higher voltage (Vcs) and the bit line is supplied by a second lower voltage (Vdd) and driving the write circuit with the first higher voltage (Vcs).

Thereby driving the write circuit with the first, higher voltage means that the first, higher voltage is only used to switch the write circuit on and off, wherein the write circuit itself can be supplied by another voltage, preferably the second, lower voltage. This is because the write circuit at its output has to provide the second, lower voltage, since the bit line has to remain at this lower voltage in order to keep the power consumption at a low level.

The design structure according to the invention results in several SRAM array internal improvements, system level simplifications and provides the following advantages over the state of the art:

since preferably word line and a write enable signal, which controls and drives the write circuit, are at the same voltage level now, much better tracking can be achieved and guaranteed, an increased operating window is achieved where proper functionality of the SRAM array is guaranteed.

the Vcs/Vdd operating window is increased, allowing more variations, simplifying the system requirements and reducing costs, (Vcs) can be further increased for better performance, and The logic core voltage Vdd can be further reduced for power savings.

In a preferred embodiment of the design structure according to the invention, driving the write circuit with the first higher voltage is performed by using a write enable signal at the first, higher voltage (Vcs) to switch the write circuit on and off.

In a second aspect of the invention, an SRAM cell comprises at least one bit line (BL), at least one word line (WL) and a write circuit, wherein the SRAM cell is supplied by a first higher voltage (Vcs), the SRAM cell being accessible for read and write operations via at least one bit line (BL) that is connected to a write circuit preferably controlled and driven by a write enable signal, the SRAM cell further being addressable by at least one word line (WL) in order to access the SRAM cell by the bit line, wherein the word line (WL) is supplied by the first higher voltage (Vcs) and the bit line (BL) is supplied by a second lower voltage (Vdd), characterized in that the write circuit is driven with the first higher voltage (Vcs) during write operations.

Preferably the write circuit is driving a low level (e.g. ground (gnd)) to one bit line, and driving a higher level (e.g. Vdd) to the other. The sources of the actual write devices of the write circuit are connected to (gnd) or (Vdd) respectively, the drain to the bit line, thereby driving the bit lines to a low (gnd) and high (Vdd) voltage level. The gate of the write circuit is driven by the first, higher voltage (Vcs). Since the bit lines itself are only charged to the second, lower voltage (Vdd), the overall power consumption is reduced.

Preferably the write circuit itself is supplied by the second, lower voltage (i.e. (Vdd)).

In a preferred embodiment of the SRAM cell according to the invention, the write circuit comprises a gate in order to switch it on and off, wherein in order to drive the write circuit by the first, higher voltage, the gate of the write circuit is fed with said first, higher voltage. To do so, preferably a write enable signal at Vcs is used.

Thereby, it is important to mention that the drive strength or maximum current of the write circuit is mainly determined by the higher gate voltage (Vcs), thereby allowing the write circuit to write the cell that is also at the higher voltage. Since both are connected to the same voltage, the increased stability of the cell at higher voltages is compensated by higher drive strength of the write devices, allowing for always overwriting the cell.

In order to feed the first, higher voltage to the gate of the write device, preferably an arrangement of three successive stages (i.e inverters) is used, wherein said arrangement comprises an even number of stages supplied by the first higher voltage (Vcs). The first stage is still connected to the low voltage (Vdd), while the next two stages are connected to (Vcs). This simple level shifter suppresses any leakage at the interface stage between the two voltages during off-state.

In another aspect of the invention, an SRAM array comprises a plurality of SRAM cells, at least one bit line (BL) and a write circuit, characterized in that the cells of the SRAM array are accessible by at least one bit line (BL) connected to the write circuit, wherein the write circuit is driven by a first higher voltage (Vcs) during write operations.

Thereby it is possible that the write circuit comprises a gate in order to switch it on and off, wherein in order to drive the write circuit with the first, higher voltage Vcs, the gate of the write circuit is fed with said first, higher voltage (e.g. by a write enable signal at (Vcs)).

In yet another aspect of the invention, a write circuit for an SRAM cell or an SRAM array comprises a gate in order to switch the write circuit on and off, wherein the write circuit is driven at a core logic voltage (Vdd), characterized in that and during write operations, the write circuit is driven by a higher cell specific voltage (Vcs).

By supplying the write circuit at the lower (Vdd), the overall power consumption of the write circuit is not increased compared to the state of the art, wherein by only driving the gate of the write circuit with the higher (Vcs) during write operations, a bit line of an SRAM cell or array connected with the output of the write circuit during write operations is still supplied with the lower voltage, but the write driver is much stronger due to the higher voltage at the gate which improves writeability of the cell. A special advantage of this scheme is that increasing the cell voltage (Vcs) makes the cell more stable, but also harder to write. Also, the strength or maximum current of the write driver is increased, which guarantees that the cell can still be written. Thereby, again an arrangement of successive inverter stages can be used in order to generate a write enable signal at (Vcs) to be used to switch the gate of the write circuit.

DETAILED DESCRIPTION OF EMBODIMENTS OF THE INVENTION

The present invention proposes a new scheme that preferably uses the array specific voltage (Vcs) for the write operation to significantly improve the writeability and to open up the operating window without increasing the overall power consumption.

Figure 3:
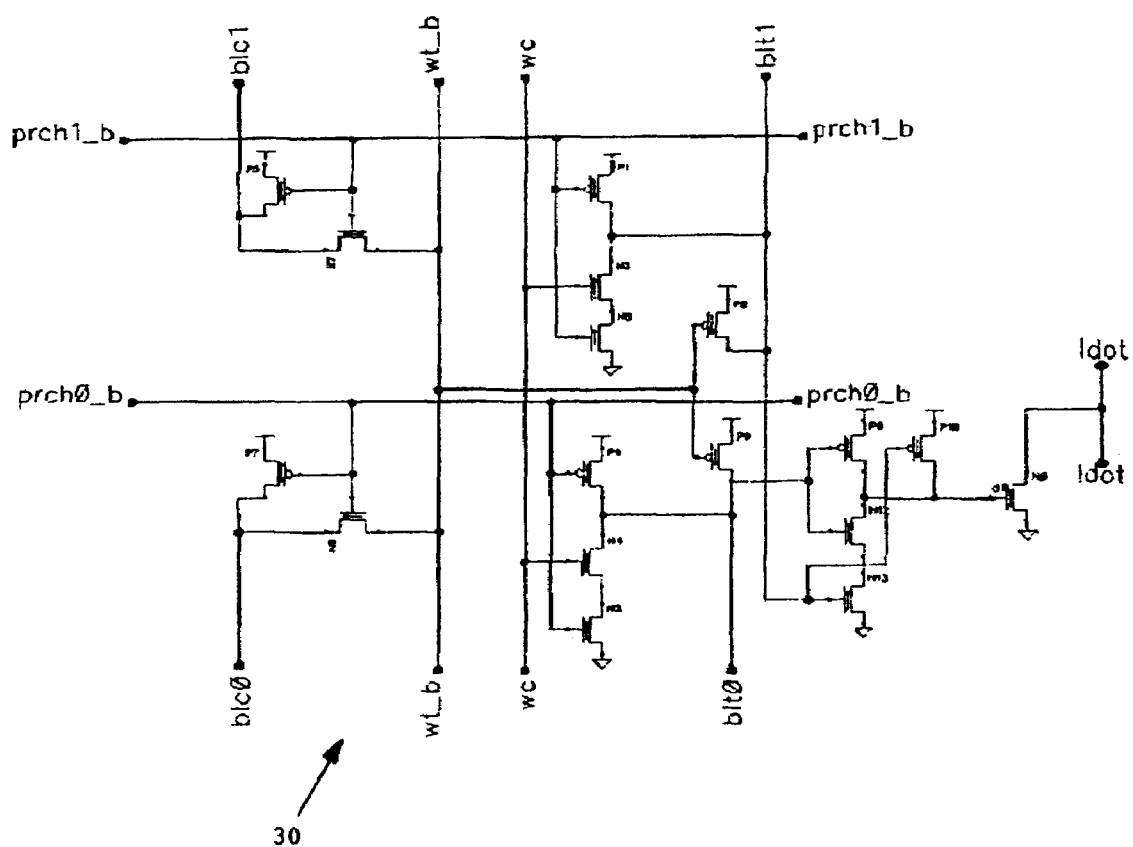
FIG. 3 is block diagram of a write circuit according to the invention.

FIG. 3 shows a read/write circuit 30, which includes a write driver according to the invention. The write device is connected at its gates to (Vcs) via the write enable signal prch0_b, prch1_b, thereby providing a higher drive capability that tracks with (Vcs) and the stability improvement of the cell, while the bit line is still at the lower (Vdd), in order to reduce stress.

The actual devices of interest within the write driver shown in FIG. 3 are the group of N2, P4 & N9 which are controlled by prch0_b, and the group of N5, P1 & N7 controlled by prch1_b. The prch_b acts as the write enable signal. While prch_b is low, the two bit lines blt and blc are both restored to the (Vdd) level. When prch0_b goes high and wc is high, the bit line blt0 is pulled down to zero through N2 and N4. The gate of the device N2 is connected to prch0_b, which is at the high (Vcs) state, and therefore stronger than a standard device and tracks with (Vcs). If wt_b is low, blc0 is pulled down through N9 which is also driven by (Vcs) through prch0_b, therefore also in the overdrive state. For proper functionality control logic has to assure that during write wc and wt_b always have the same level (i.e. either low or high). The same applies to the other devices controlled by prch1_b which drives blt1 and blc1.

The write circuit 30 is driving a low level (e.g. ground (gnd)) to one bit line, and driving a higher level (e.g. (Vdd)) to the other. The sources of actual write devices are connected to (gnd) or (Vdd) respectively, the drain to the bit line, thereby driving the bit lines to a low (gnd) and high (Vdd) voltage level. The gate of the write devices N2, N9, N7, N5 are driven by the first, higher voltage (Vcs). Since the bit lines are only charged to the second, lower voltage (Vdd), the overall power consumption is reduced.

But the drive strength or maximum current of the write devices (N2, N9, N7, N5) is mainly determined by the higher gate voltage (Vcs), thereby allowing the write driver to write the cell that is also at the higher voltage. Since both are connected to the same voltage, the increased stability of the cell at higher voltages is compensated by higher drive strength of the write devices, allowing for always overwriting the cell.

The write driver has the function of a tri-state circuit. During read it has to be turned off to not interfere with the read. In that state wc is forced to a zero, and wt_b to a one. Now, when prch_b goes high, there is no conducting path on either side (blt, blc) to gnd. Therefore both bitlines keep the precharge level of (Vdd). Now, when the cell is selected it can discharge one bitline according to the state in the cell, which is the standard read case. During write either wc and wt_b have to be high (Vdd), or wc and wt_b have to be low (gnd). In the first case blt is driven to a zero (while blc stays high), and the second blc is driven to a zero, while blt stays high.

Figure 1:
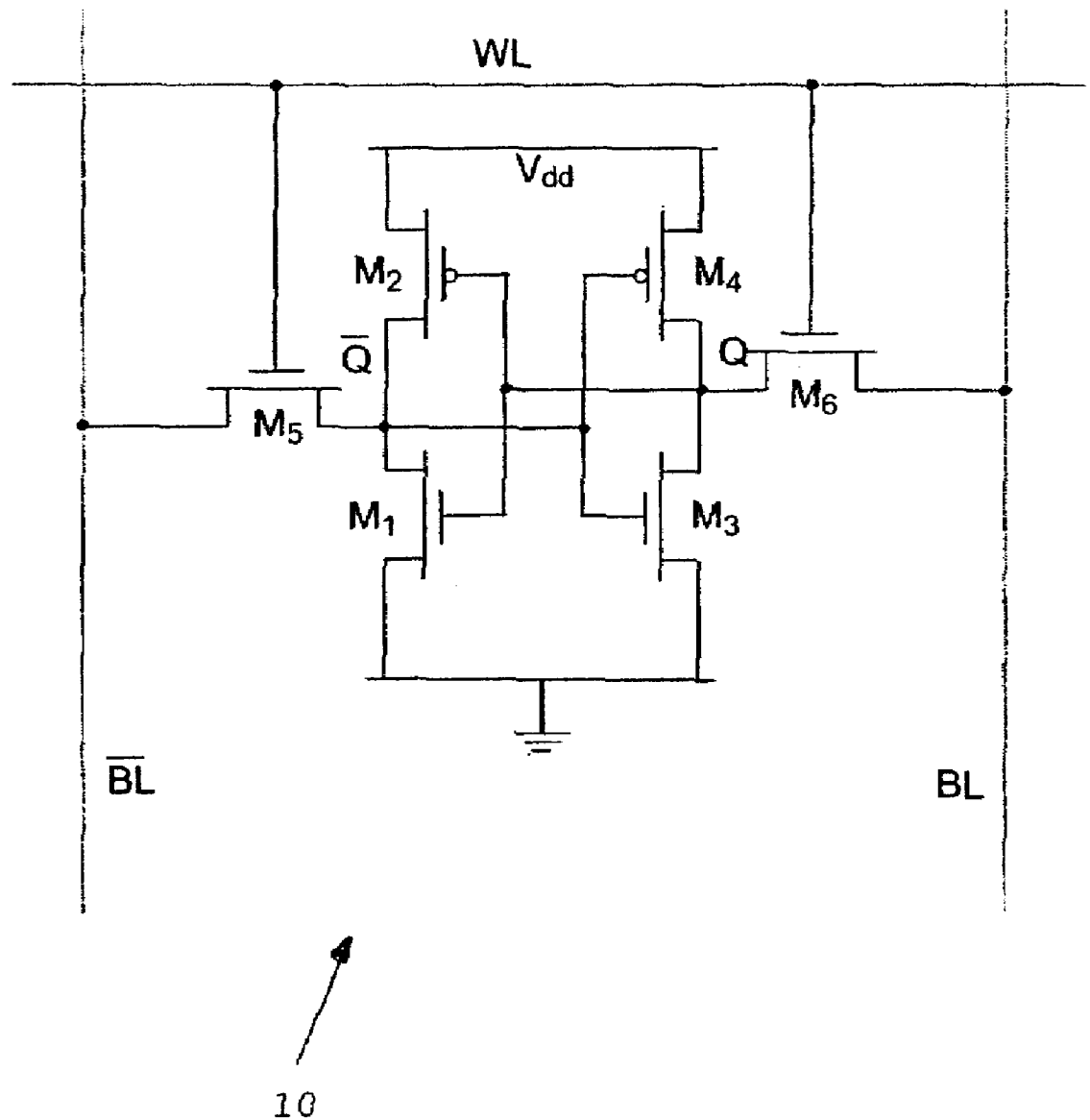
FIG. 1 is a schematic diagram of an SRAM cell according to the state of the art.
Figure 2:
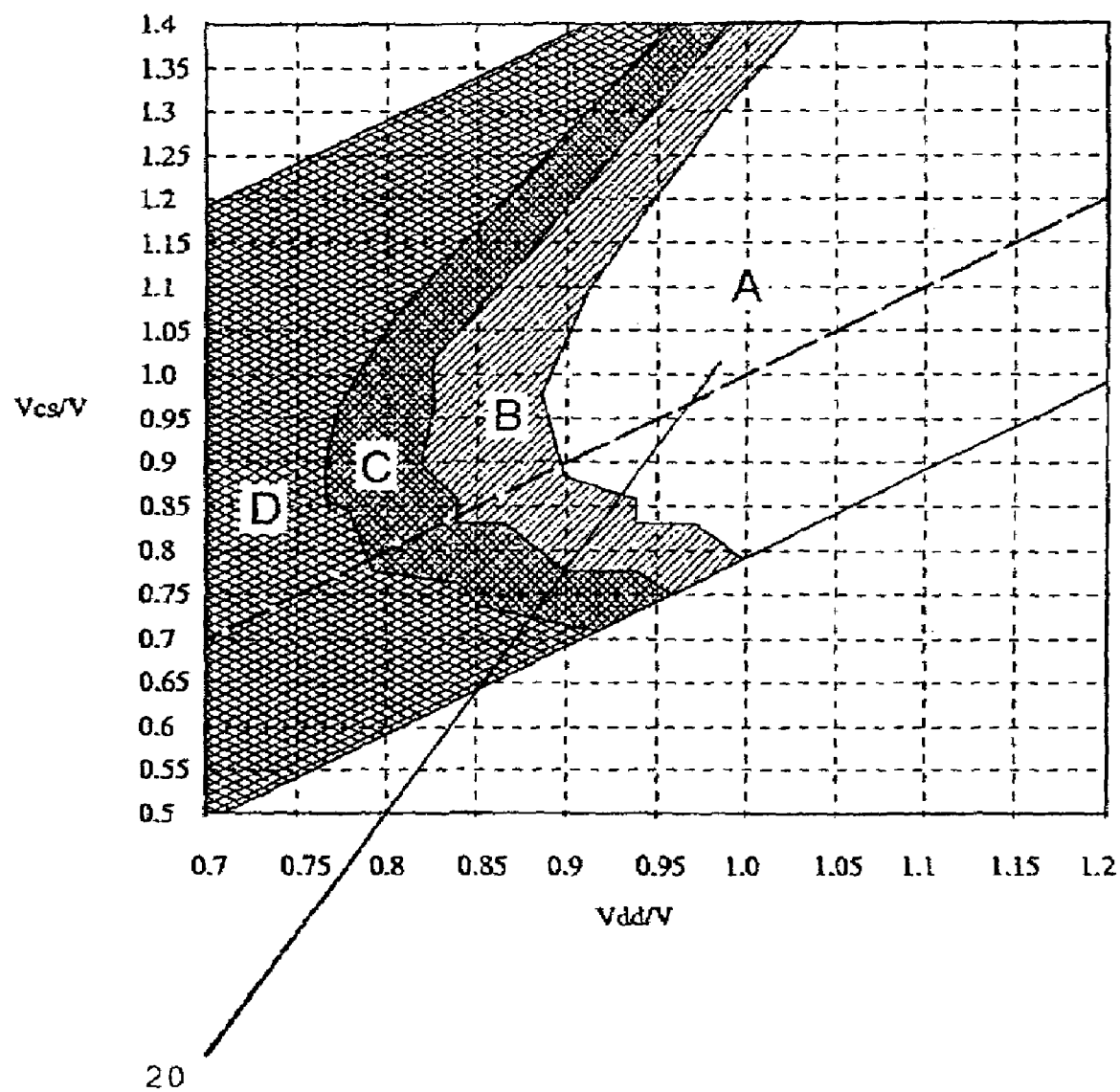
FIG. 2 is a diagram that shows the operating window of an SRAM cell supplied with (Vcs), wherein the word line WL is also supplied with (Vcs) and the bit line BL is supplied with (Vdd)
Figure 4:
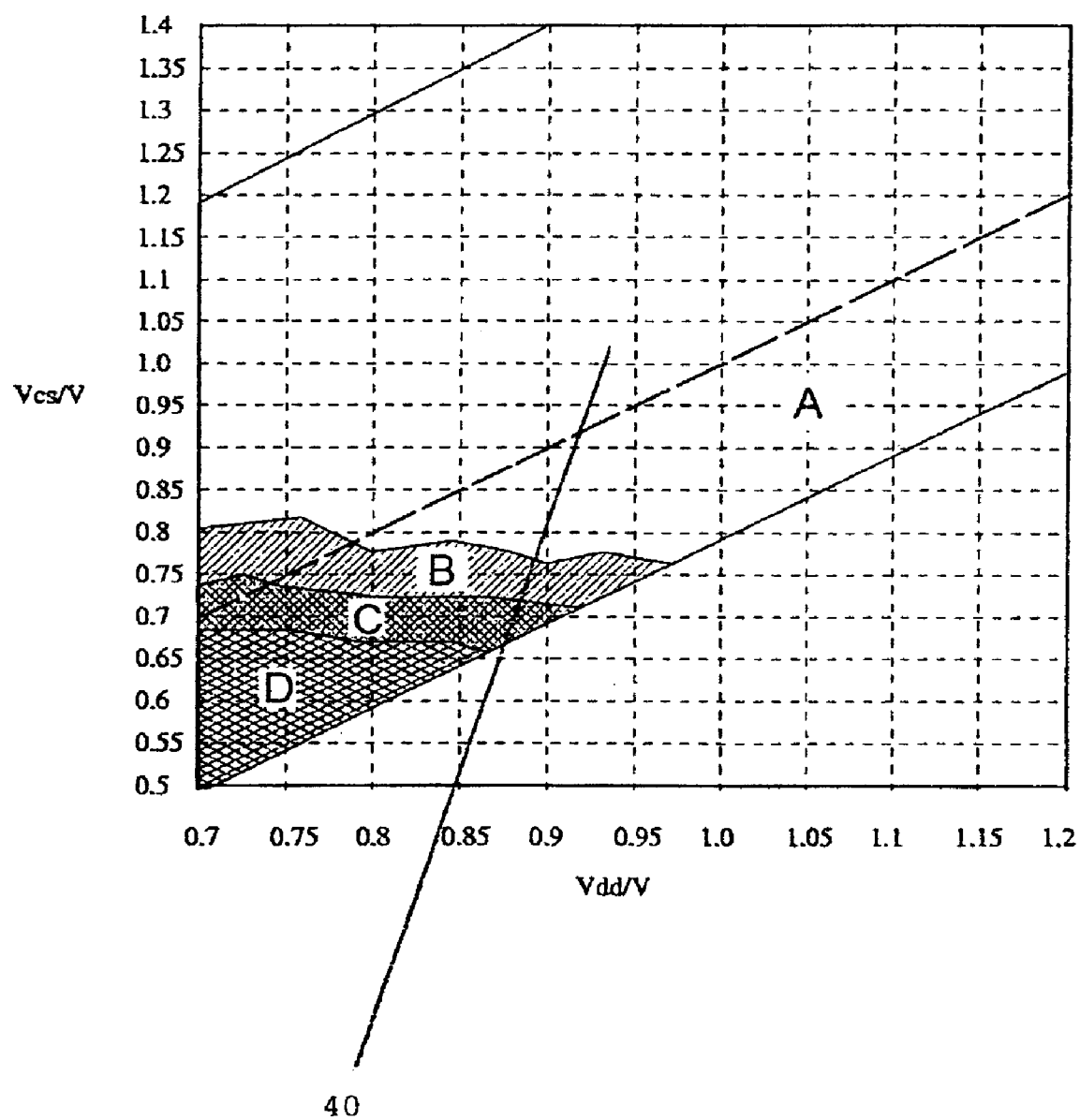
FIG. 4 is a diagram that shows the operating window of an SRAM cell according to the invention.

FIGS. 2 and 4 are so-called shmoo plots (i.e. graphical representations of selected test parameters in an electronic circuit, where inputs such as voltage and clock frequency are constantly varied). Comparing the resulting shmoo plot depicted in FIG. 4 with the diagram in FIG. 2 shows that there is no longer a limitation to increase (Vcs). The operating window 40 of an SRAM cell according to the invention, represented by the region A in FIG. 4, is increased, since (Vdd) does not have to track (Vcs) anymore.

Figure 5:
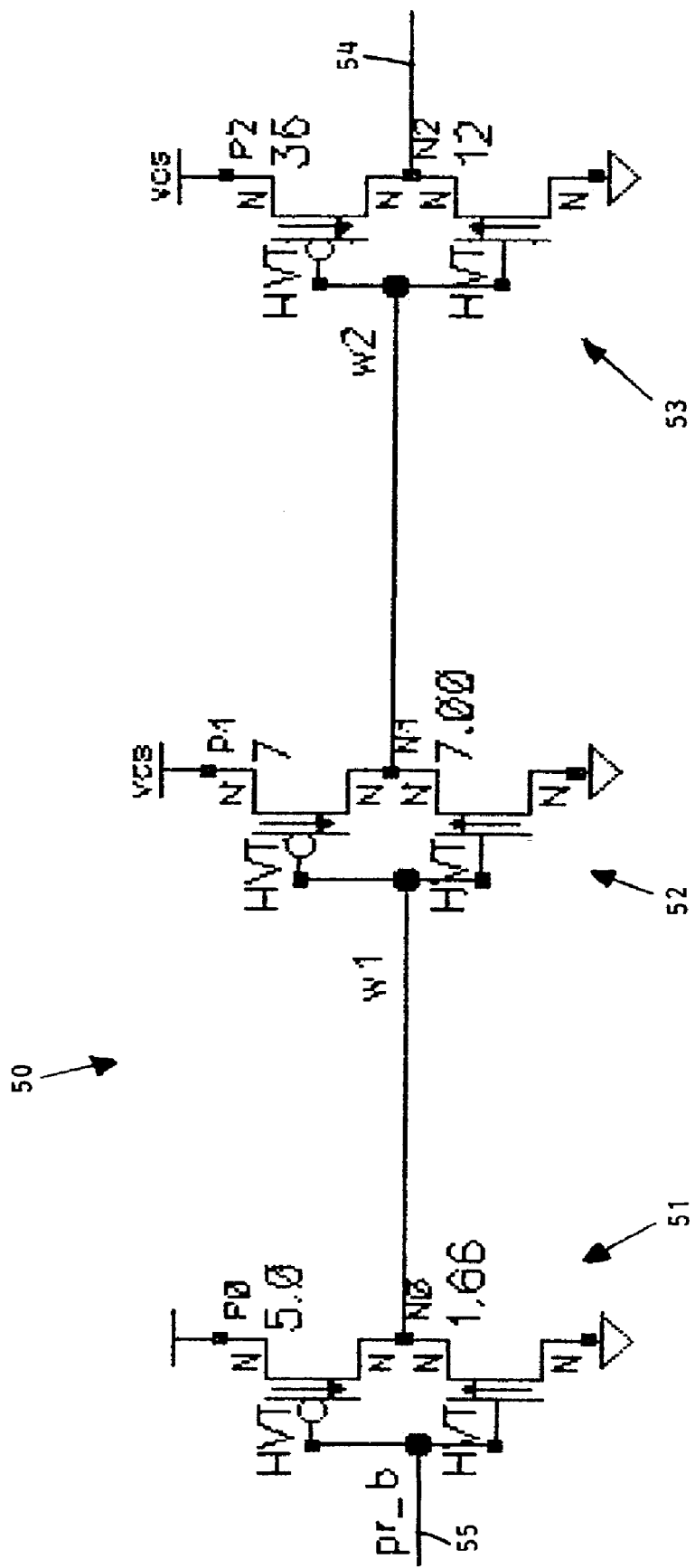
FIG. 5 is a block diagram of a gate of a write circuit according to the invention.

FIG. 5 shows a level shifter 50 generating a write enable signal at (Vcs) which drives the write circuit. More particularly, the level shifter 50 feeds the write enable signal to the gate of the write circuit. The level shifter 50 is a pre-stage to the write circuit. At its output 54 the level shifter 50 provides the write enable signal at (Vcs). With its output 54 the level shifter 50 is connected with the gate of a write circuit.

The level shifter 50 comprises an arrangement of three successive inverters 51, 52, 53, in order to feed a (Vcs) in the gate 50 of the write circuit. Thereby, the first inverter 51 is connected with an input 55 providing a signal controlling whether a write enable signal has to be generated or not (i.e. if the write circuit has to be switched on or remains switched off). This way the first inverter 51 is supplied with (Vdd) and provides an inverted output of said signal at (Vdd). The second inverter 52 connected with the first inverter 51 is supplied with (Vcs) and provides an output analogous to the output of the write circuit, but at (Vcs). The third inverter 53 connected with the second inverter 52 provides an output analogous to the output of the first inverter 51, but at the first, higher voltage. The third inverter 53 with its output 54 provides the write enable signal (prch0_b, prch1_b in FIG. 3). This allows feeding (Vcs) in the gate of the write circuit without increasing the supply voltage of the write circuit, in order to keep the power consumption of the write circuit at a low level.

The level shifter 50 according to the invention recreates the output of the first inverter, but at the higher voltage (Vcs). Doing so provides a tracking between the writeability and stability of the cell by using the cell specific voltage (Vcs) to drive the gate of the write driver while keeping the bit line restore and driver source at (Vdd). Since power consumption is mainly determined by the bit line voltage (Vdd), the power stays constant and also in the write circuit that preferably is still driven by (Vdd).

More particularly, the first stage 51 is still connected to the low voltage (Vdd), while the next two stages 52, 53 are connected to (Vcs). This simple level shifter 50 suppresses any leakage at the interface stage between the two voltages during off-state. In the off-state the input to the first stage 51 is high (Vdd) which causes the first stage 51 to generate a zero (gnd) which is the input to the second stage 52 which is connected to (Vcs). The zero generates a high (Vcs) level at the output of the second stage 52. From there on we are completely in the (Vcs) power domain. The third stage 53 is at (Vcs) as the input signal itself. Thereby, only the one driver that is selected would cause some leakage current because the p-device of the second inverter stage 52 never turns-off completely. The input to the first inverter 51 is zero (gnd) and it generates a high (Vdd) signal which is the input to the second stage 52. This high (Vdd) level turns on the n-device of the second inverter 52, but the p-device is never completely turned off (i.e. the gate is at (Vdd) while the source is at (Vcs)). Since there is only one stage selected at a time, this leakage can be neglected.

In order to completely eliminate sub-threshold current in off-state, even numbers of stages always have to be connected to the higher voltage (Vcs). More complex level shifter circuits are known, but this scheme minimizes the number of devices.

According to the state of the art, a stability improvement via a higher (Vcs) always resulted in a writeability loss because the voltage difference between (Vcs) and (Vdd) increased. Now, according to the invention, the bit line during write operations is also supplied with (Vcs) resulting in an increased writeability and performance of the cell. Since the bit line preferably during all other states or operations is supplied at a lower voltage (e.g. (Vdd) for read operations and ground during idle mode), the overall power consumption is not increased.

It is important to mention that it is a main idea of the invention to improve writeability by overdriving the write circuit with (Vcs), but to keep the bit lines at the lower (Vdd) voltage. Thereby overdriving means, that the actual power supply of the write circuit devices is still at (Vdd), which determines the bit line voltage, but the gate of the write circuit (i.e. the gate signal) is driven by the higher (Vcs), which increases the write current. An important advantage that is achieved by the invention is that the write current now tracks with (Vcs). Thereby, a higher (Vcs) means higher cell stability and the cell is harder to write, but also higher drive current which compensates for any loss in writeability. This achieves higher stability at higher voltage, while keeping the writeability constant.

The solution according to the invention results in several SRAM array internal improvements, system level simplifications and provides additional capabilities:

Since word line and write enable signal are at the same voltage level now, much better tracking can be achieved and guaranteed.

Increased operating window where proper functionality of the SRAM array is guaranteed.

(Vcs) no longer has to track with (Vdd) allowing more variations, simplifying the system requirements and reducing costs.

(Vcs) can be further increased for better performance.

Logic core voltage (Vdd) can be further reduced for power savings.

Figure 6:
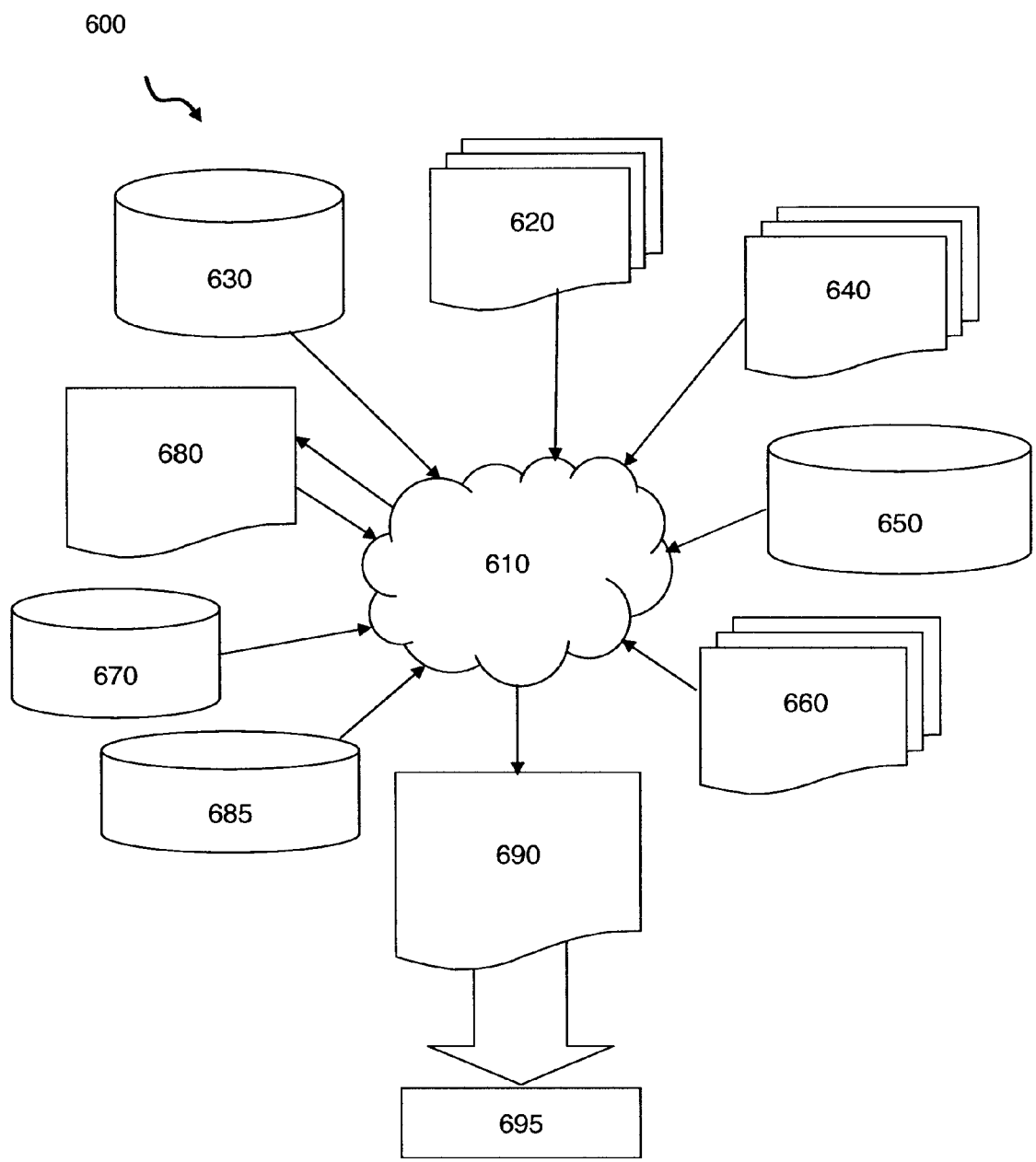
FIG. 6 is a flow diagram of a design process used in semiconductor design, manufacture, and/or test.

FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIGS. 3 and 5 in the form of schematics or HDL, a hardware-description language (e.g., Verilog, VHDL, C, etc.). Design structure 620 may be contained on one or more machine readable medium. For example, design structure 620 may be a text file or a graphical representation of an embodiment of the invention as shown in FIGS. 3 and 5. Design process 610 preferably synthesizes (or translates) an embodiment of the invention as shown in FIGS. 3 and 5 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIGS. 3 and 5, along with any additional integrated circuit design or data (if applicable), into a second design structure 690. Design structure 690 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 690 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3 and 5. Design structure 690 may then proceed to a stage 695 where, for example, design structure 690: proceeds to tape-out, is released to manufacturing, is released to a mask house, is sent to another design house, is sent back to the customer, etc.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A design structure embodied in a machine readable medium, the design structure comprising:
a write circuit for an SRAM cell or an SRAM array, wherein said SRAM cell or said SRAM array is supplied by a higher cell specific voltage (Vcs), said write circuit further comprising a gate in order to switch said write circuit on and off, wherein said write circuit is driven at a core logic voltage (Vdd), characterized in that during write operations, said write circuit is driven by said higher cell specific voltage (Vcs), characterized in that in order to drive said write circuit by said higher cell specific voltage (Vcs), said gate of said write circuit is driven by said first higher voltage (Vcs) and characterized in that in order to drive said gate of said write circuit with said first higher voltage (Vcs), an arrangement of at least three successive stages is used, said at least three successive stages comprising an even number of stages supplied by said first higher voltage (Vcs).

2. The design structure of claim 1, wherein said design structure is synthesized into a netlist.

3. The design structure of claim 1, wherein said design structure resides on a storage medium as a data format used for the exchange of layout data of integrated circuits.

\* \* \* \* \*